United States Patent
Eppler et al.

(10) Patent No.: US 7,547,635 B2
(45) Date of Patent: Jun. 16, 2009

(54) PROCESS FOR ETCHING DIELECTRIC FILMS WITH IMPROVED RESIST AND/OR ETCH PROFILE CHARACTERISTICS

(75) Inventors: Aaron Eppler, Fremont, CA (US); Mukund Srinivasan, Fremont, CA (US); Robert Chebi, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 230 days.

(21) Appl. No.: 10/170,424

(22) Filed: Jun. 14, 2002

(65) Prior Publication Data

US 2003/0232504 A1    Dec. 18, 2003

(51) Int. Cl.
    *H01L 21/302* (2006.01)
(52) U.S. Cl. .............. 438/710; 438/714; 438/715; 438/723; 438/725; 438/735; 438/743; 216/67; 216/79; 216/80; 252/79.1
(58) Field of Classification Search .............. 438/700, 438/706, 712, 710, 723; 252/79.1, 79.4
    See application file for complete search history.

(56) References Cited

U.S. PATENT DOCUMENTS

| | | | |
|---|---|---|---|
| 4,283,249 A | 8/1981 | Ephrath | |
| 4,340,462 A | 7/1982 | Koch | |
| 4,807,016 A * | 2/1989 | Douglas | 257/774 |
| 4,857,140 A | 8/1989 | Loewenstein | |
| 4,978,419 A | 12/1990 | Nanda et al. | |
| 5,013,398 A | 5/1991 | Long et al. | |
| 5,013,400 A | 5/1991 | Kurasaki et al. | |

(Continued)

FOREIGN PATENT DOCUMENTS

EP    0050972 A2    5/1982

(Continued)

OTHER PUBLICATIONS

Horiike Y. et al., "High Rate and Highly Selective SIO2 Etching Employing Inductively Coupled Plasma and Discussion on Reaction Kinetics", Journal of Vacuum Science and Technology: Part A, American Institute of Physics. New York, US, vol. 13, No. 3, Part 1, May 1, 1995, pp. 801-809.

(Continued)

*Primary Examiner*—Anita K Alanko
(74) *Attorney, Agent, or Firm*—Buchanan Ingersoll & Rooney PC

(57) ABSTRACT

A process of etching openings in a dielectric layer includes supporting a semiconductor substrate in a plasma etch reactor, the substrate having a dielectric layer and a patterned photoresist and/or hardmask layer above the dielectric layer; supplying to the plasma etch reactor an etchant gas comprising (a) a fluorocarbon gas ($C_xF_yH_z$, where $x \geq 1$, $y \geq 1$, and $z \geq 0$), (b) a silane-containing gas, hydrogen or a hydrocarbon gas ($C_xH_y$, where $x \geq 1$ and $y \geq 4$), (c) an optional oxygen-containing gas, and (d) an optional inert gas, wherein the flow rate ratio of the silane-containing gas to fluorocarbon gas is less than or equal to 0.1, or the flow rate ratio of the hydrogen or hydrocarbon gas to fluorocarbon gas is less than or equal to 0.5; energizing the etchant gas into a plasma; and plasma etching openings in the dielectric layer with enhanced photoresist/hardmask to dielectric layer selectivity and/or minimal photoresist distortion or striation.

22 Claims, 3 Drawing Sheets

U.S. PATENT DOCUMENTS

| | | | |
|---|---|---|---|
| 5,094,978 A * | 3/1992 | Miyagaki et al. ............ 438/609 |
| 5,201,994 A | 4/1993 | Nonaka et al. |
| 5,266,154 A | 11/1993 | Tatsumi |
| 5,300,460 A * | 4/1994 | Collins et al. ............... 438/712 |
| 5,312,518 A | 5/1994 | Kadomura |
| 5,338,399 A * | 8/1994 | Yanagida ..................... 216/67 |
| 5,423,945 A | 6/1995 | Marks et al. |
| 5,556,501 A | 9/1996 | Collins et al. |
| 5,609,720 A | 3/1997 | Lenz et al. |
| 5,716,485 A * | 2/1998 | Salimian et al. ........ 156/345.43 |
| 5,767,021 A | 6/1998 | Imai et al. |
| 5,846,884 A | 12/1998 | Naeem et al. |
| 5,872,061 A | 2/1999 | Lee et al. |
| 5,888,414 A | 3/1999 | Collins et al. |
| 5,892,286 A | 4/1999 | Toyoda et al. |
| 5,965,035 A | 10/1999 | Hung et al. |
| 5,965,463 A | 10/1999 | Cui et al. |
| 6,033,990 A | 3/2000 | Kishimoto et al. |
| 6,068,784 A | 5/2000 | Collins et al. |
| 6,074,959 A * | 6/2000 | Wang et al. ................. 438/738 |
| 6,080,662 A | 6/2000 | Chen |
| 6,090,303 A | 7/2000 | Collins et al. |
| 6,117,786 A * | 9/2000 | Khajehnouri et al. ....... 438/700 |
| 6,183,655 B1 | 2/2001 | Wang et al. |
| 6,191,043 B1 | 2/2001 | McReynolds |
| 6,194,325 B1 | 2/2001 | Yang et al. |
| 6,214,744 B1 | 4/2001 | Wada |
| 6,217,785 B1 | 4/2001 | Collins et al. |
| 6,217,786 B1 | 4/2001 | Hills et al. |
| 6,238,588 B1 | 5/2001 | Collins et al. |
| 6,251,792 B1 | 6/2001 | Collins et al. |
| 6,277,758 B1 | 8/2001 | Ko |
| 6,284,149 B1 * | 9/2001 | Li et al. ......................... 216/64 |
| 6,316,167 B1 | 11/2001 | Angelopoulos et al. |
| 6,379,872 B1 | 4/2002 | Hineman et al. |
| 6,391,790 B1 | 5/2002 | Stoehr et al. |
| 6,762,127 B2 * | 7/2004 | Boiteux et al. .............. 438/702 |
| 6,897,154 B2 * | 5/2005 | Leung et al. ................ 438/706 |
| 7,132,363 B2 * | 11/2006 | Yang et al. ................... 438/639 |
| 7,179,757 B2 * | 2/2007 | RamachandraRao et al. ........................ 438/780 |
| 7,229,930 B2 * | 6/2007 | Jain et al. .................... 438/714 |
| 7,294,580 B2 * | 11/2007 | Yun et al. .................... 438/710 |
| 2001/0001743 A1 | 5/2001 | McReynolds |
| 2003/0181054 A1 | 9/2003 | Lee et al. |
| 2003/0232504 A1 | 12/2003 | Eppler et al. |
| 2004/0171260 A1 | 9/2004 | Choi et al. |
| 2004/0209469 A1 | 10/2004 | Harada et al. |
| 2005/0103748 A1 | 5/2005 | Yamaguchi et al. |
| 2005/0266691 A1 * | 12/2005 | Gu et al. ..................... 438/706 |

FOREIGN PATENT DOCUMENTS

| | | |
|---|---|---|
| EP | 0305268 A1 | 3/1989 |
| EP | 0496614 A1 | 7/1992 |
| EP | 0553961 A2 | 8/1993 |
| EP | 0777267 A1 | 6/1997 |
| EP | 0889507 A1 | 1/1999 |
| EP | 1041614 A1 | 10/2000 |
| JP | 11-016887 | 1/1999 |
| JP | 11-111680 | 4/1999 |
| JP | 2000340552 | 12/2000 |
| JP | 2001-110784 A | 4/2001 |
| JP | 2003/133287 A | 5/2003 |
| WO | WO 00-63960 A | 5/2001 |
| WO | 03030237 A | 4/2003 |
| WO | 2004/003988 A | 1/2004 |
| WO | WO 99-57757 A | 10/2004 |

OTHER PUBLICATIONS

Norstrom H., "Silicon Surface Damage Caused by Reactive Ion Etching in Fluorocarbon Gas Mixtures Containing Hydrogen", Journal of Vacuum Science and Technology: Part B, American Institute of Physics, New York, US, vol. 9, No. 1, 1991, pp. 34-40.

Kumar M. J. et al., "Selective Reactive Ion Etching of PECVD Silicon Nitride over Amorphous Silicon in CF4/H2 and Nitrogen Containing CF4/H2 Plasma Gas Mixtures", Solid State Electrics, Elsevier Science Publishers, Barking, GB, vol. 39, No. 1, 1995, pp. 33-37.

Maeda M. et al., "Low Dielectric Constant Amorphous SIBN Ternary Films Prepared by Plasma-Enhanced Deposition", Japanese Journal of Applied Physics, Publication Office Japanese Journal of Applied Physics., Tokyo, Japan, vol. 26, No. 5, Part 1, May 1, 1987, pp. 660-665.

Norstrom, H. et al., "RIE of $SiO_2$ in doped and undoped fluorocarbon plasmas", Vacuum, Pergamon Press Ltd., Great Britain, vol. 32, No. 12, pp. 737-745, 1982.

Standaert, T.E.F.M. et al., "Patterning of fluorine-, hydrogen-, and carbon-containing $SiO_2$-like low dielectric constant materials in high-density fluorocarbon plasmas: Comparison with $SiO_2$", Journal of Vacuum Science and Technology A 173(3), May/Jun. 1999, pp. 741-748.

Notification of Transmittal of the International Search Report or the Declaration for PCT/US03/18791 dated Jan. 16, 2004.

Written Opinion dated Mar. 2, 2004 for PCT/US03/18791.

Search Report dated Sep. 14, 2007 and Written Opinion dated Oct. 5, 2007 for SG200608675-5.

Search Report and Examination Report issued Jul. 11, 2008 in corresponding Singapore Application No. 200608686-2.

Written Opinion dated Nov. 11, 2008, in corresponding Singapore Application No. 200608675-5.

* cited by examiner

PROCESS FOR ETCHING DIELECTRIC FILMS WITH IMPROVED RESIST AND/OR ETCH PROFILE CHARACTERISTICS

FIELD OF THE INVENTION

The present invention relates to an improved method for plasma etching a dielectric layer in the fabrication of integrated circuits. Specifically, the present invention relates to enhanced photoresist and/or hardmask facet selectivity for maintaining critical dimension (CD), minimizing striations, and improving profile in the etching of a dielectric layer.

BACKGROUND OF THE INVENTION

A common requirement in integrated circuit fabrication is plasma etching of openings such as contacts, vias and trenches in dielectric materials. The dielectric materials include doped silicon oxide such as fluorinated silicon oxide, undoped silicon oxide, silicate glasses such as boron phosphate silicate glass (BPSG) and phosphate silicate glass (PSG), doped or undoped thermally grown silicon oxide, doped or undoped TEOS deposited silicon oxide, organic and inorganic low-k materials, etc. The dielectric dopants include boron, phosphorus and/or arsenic.

The dielectric can overlie a semiconductive or conductive layer such as polycrystalline silicon; metals such as aluminum, copper, titanium, tungsten, molybdenum or alloys thereof; nitrides such as titanium nitride; metal silicides such as titanium silicide, cobalt silicide, tungsten silicide, molybdenum silicide, etc.

Using conventional photolithography a layer of photoresist and/or a hard mask can be used to pattern the dielectric. Optionally, an anti-reflective coating (ARC) deposited beneath the photoresist layer may be used in order to minimize reflection during resist exposure and improve the fidelity of the resist pattern.

Vacuum processing chambers are generally used for etching of materials on substrates by supplying process gas to the vacuum chamber and application of an RF field to the gas. Plasma etching can be carried out, for example, in medium density reactors such as the parallel plate plasma reactor chambers described in U.S. Pat. Nos. 4,340,462 and 5,013,398 or the triode-type reactors described in U.S. Pat. No. 5,013,400.

Techniques to achieve profile control of deep openings having high aspect ratios of at least 5:1 are disclosed in commonly owned U.S. Pat. Nos. 6,117,786 and 6,191,043. Of these, the '786 patent discloses etching of openings in silicon oxide layers using a gas mixture containing fluorocarbon, oxygen and nitrogen reactants wherein the oxygen and nitrogen are added in amounts effective to control the profile of the etched opening. The '043 patent discloses etching of deep openings 10 to 15 μm deep in a silicon layer by using a chlorine-containing etch gas chemistry to etch through a native oxide layer over the silicon layer and using a gas mixture containing an oxygen reactant gas, helium, an inert bombardment-enhancing gas and a fluorine-containing gas such as $SF_6$, $C_4F_8$, $CF_4$, $NF_3$ and $CHF_3$ to etch the silicon layer.

Conventionally, fluorocarbon, hydrofluorocarbon, and/or chlorofluorocarbon-based etch gases have been widely used to etch dielectric layers because the F and Cl constituents facilitate etching both via a radical reaction and an ion-assisted reaction while sidewall protection is afforded using carbonaceous polymers formed on the surface of the substrate.

Selectivity is desirable with respect to overlying photoresist, hardmask, and ARC layers as well as the bottom etch stop layer. Selectivity is especially desirable at the corners of a patterned photoresist or hardmask layer because the corners have a geometry favorable to fast etching that tends to create facets which undesirably impact the critical dimensions of the feature. Photoresist/hardmask faceting can lead to via/trench "blowout" of device critical dimensions, while low selectivity to etch stop layers may lead to significant sputtering onto the via sidewall. Accordingly, there is a need in the art for a plasma etching technique which achieves high photoresist or hardmask etch selectivity, high dielectric etch rate, low pollution and low damage. More particularly, there is a need for a plasma process which enhances photoresist to oxide etch selectivity in order to achieve a highly anisotropic dielectric etch with minimal damage or distortion of the original photoresist pattern.

SUMMARY OF THE INVENTION

The invention provides a process of etching openings in a dielectric layer, comprising the steps of supporting a semiconductor substrate in a plasma etch reactor, the substrate having a dielectric layer and a patterned photoresist and/or hardmask layer above the dielectric layer; supplying to the plasma etch reactor an etchant gas comprising (a) a fluorocarbon gas ($C_xF_yH_z$, where $x \geq 1$, $y \geq 1$, and $z \geq 0$), (b) a silane-containing gas, hydrogen or a hydrocarbon gas ($C_xH_y$, where $x \geq 1$ and $y \geq 4$), (c) an optional oxygen-containing gas, and (d) an optional inert gas, wherein the flow rate ratio of the silane-containing gas to fluorocarbon gas is less than or equal to 0.1, or the flow rate ratio of the hydrogen or hydrocarbon gas to fluorocarbon gas is less than or equal to 0.5; energizing the etchant gas into a plasma; and plasma etching openings in the dielectric layer with enhanced photoresist/hardmask to dielectric layer selectivity and/or minimal photoresist distortion or striation.

In a preferred embodiment, the plasma etch reactor is a dual-frequency medium-density capacitively coupled plasma reactor including an upper showerhead electrode optionally supplied with 500 to 3000 watts of RF energy and a bottom electrode optionally supplied with 500 to 3000 watts of RF energy, RF energy being supplied at two different frequencies to either the bottom electrode or at different first and second frequencies to the showerhead electrode and bottom electrode. According to a preferred embodiment, an RF bias can be applied to the semiconductor substrate during the etching step.

During the process, pressure in the plasma etch reactor can be 5 to 200 mTorr and the temperature of the substrate support can be −20° C. to +80° C.

The openings can comprise vias, contacts, and/or trenches of a dual damascene, self-aligned contact or self-aligned trench structure. Furthermore, the etched openings can be 0.3 μm or smaller sized openings having substantially straight profiles wherein top, middle and bottom critical dimensions of the openings are substantially the same, and the openings have an aspect ratio of at least 5:1. According to a preferred embodiment, the etched openings can be 0.25 μm or smaller sized openings having substantially straight profiles wherein top, middle and bottom critical dimensions of the openings are substantially the same, and the openings have an aspect ratio of at least 10:1.

The dielectric layer can comprise a doped or undoped silicon dioxide, BPSG, BSG, FSG, PSG, TEOS, thermal silicon oxide or inorganic low-k material or organic low-k material. The dielectric layer can overlay a conductive layer selected from the group consisting of Al, Al alloys, Cu, Cu alloys, Ti, Ti alloys, doped or undoped polycrystalline or single crystal silicon, TiN, TiW, Mo, silicides of Ti, W, Co and/or Mo or alloys thereof. The semiconductor substrate can further include an optional stop layer and/or mask layer selected from silicon nitride, silicon carbide or silicon oxynitride over the dielectric layer and/or between the dielectric and conductive layer. According to a preferred embodiment, the dielectric layer can include a stack of layers of low-k materials with or without etch stop layers therebetween, the openings being etched to depths of at least 2 μm.

According to a preferred embodiment, the $C_xF_yH_z$ can form a protective sidewall polymer on sidewalls of the etched openings; the silane-containing gas, hydrogen, or hydrocarbon reactant maintains a desired concentration of polymer precursor species in the reactor; and the oxygen-containing gas maintains a desired thickness of the sidewall polymer.

According to a further preferred embodiment, the etchant gas can include an inert gas selected from the group consisting of He, Ne, Kr, Xe and Ar, the inert gas being supplied to the plasma etch reactor at a flow rate of 5 to 1000 sccm. The $C_xF_yH_z$ can comprise at least one hydrogen-free fluorocarbon, for example, $CF_4$, $C_2F_2$, $C_2F_4$, $C_3F_6$, $C_4F_6$, $C_4F_8$ and $C_6F_6$ and/or at least one hydrogen-containing fluorocarbon, for example, $C_2HF_5$, $CHF_3$, $CH_3F$, $C_3H_2F_6$, $C_3H_2F_4$, $C_3HF_5$, and $C_3HF_7$. The etchant gas can include $C_xF_yH_z$ silane as the silane-containing gas, an oxygen-containing gas and Ar supplied to the plasma etch reactor at flow rates of 3 to 100 sccm $C_xF_yH_z$, 0.3 to 10 sccm silane, 0 to 500 sccm oxygen-containing gas, and 5 to 1000 sccm Ar. A preferred etchant gas includes $C_4F_8$, silane, $O_2$ and Ar supplied to the plasma etch reactor at flow rates of 5 to 30 sccm $C_4F_8$, 0.5 to 3 sccm silane, 0 to 40 sccm $O_2$, and 100 to 500 sccm Ar. Another preferred etchant gas includes 5 to 30 sccm $C_4F_8$, 1 to 30 sccm $H_2$ or hydrocarbon gas, 0 to 40 sccm $O_2$, and 100 to 500 sccm Ar.

The optional oxygen-containing gas may comprise $O_2$, $O_3$, CO, $CO_2$ and mixtures thereof. According to a preferred embodiment, a tapered opening can be formed in the dielectric layer using an etchant gas that is oxygen-free, or a straight opening can be formed in the dielectric layer using an etchant gas that contains oxygen supplied to the plasma etch reactor at a flow rate of 5 to 500 sccm.

According to a preferred embodiment, the etchant gas comprises $C_xF_yH_z$, hydrogen or hydrocarbon gas, an oxygen-containing gas, and Ar supplied to the plasma etch reactor at flow rates of 5 to 50 sccm $C_xF_yH_z$, 1 to 30 sccm hydrogen or hydrocarbon gas, 5 to 500 sccm oxygen-containing gas, and 100 to 600 sccm Ar. According to another preferred embodiment, the $C_xF_yH_z$ comprises $C_4F_6$ and the oxygen-containing gas comprises $O_2$ supplied to the plasma etch reactor at flow rates having a ratio of $C_4F_6:O_2$ of 0.5:1 to 3:1.

When the dielectric layer is below a patterned photoresist, the addition of the silane-containing gas, the hydrogen and/or the hydrocarbon gas to the etchant gas improves by more than 35% the resist selectively as compared with the etchant gas without the silane-containing gas, the hydrogen or the hydrocarbon gas.

BRIEF DESCRIPTION OF THE DRAWINGS

Various features and advantages of the invention will become apparent from the following detailed description of preferred embodiments in connection with the accompanying drawings in which like numerals designate like elements and in which.

DETAILED DESCRIPTION OF THE INVENTION

Figure 1A:
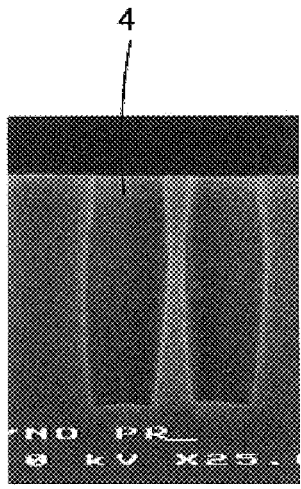
FIG. 1a shows an etched dielectric layer wherein high aspect ratio openings have bowed profiles.

The invention provides a semiconductor manufacturing process for the manufacture of integrated circuits wherein openings can be plasma etched in dielectric layers such as oxide layers while providing desired selectivity and material integrity to an overlying photoresist and/or hardmask layer. Furthermore, the invention improves the profile of the contacts etched in the manufacture of the device. The process of the invention is applicable to etching of various dielectric layers such as undoped silicon oxide and doped silicon oxide such as fluorinated silicon oxide (FSG), spin-on-glass (SOG); silicate glasses such as boron phosphate silicate glass (BPSG), phosphate silicate glass (PSG), organosilicate glass (OSG) and carbon-doped silicate glass such as CORAL (a product from Novellus Systems, Inc.); doped or undoped thermally grown silicon oxide; doped or undoped TEOS deposited silicon oxide; aromatic hydrocarbon polymer such as SiLK (a product from Dow Chemical Co.); low-k dielectrics including inorganic materials and organic polymer materials such as polyimide, organic siloxane polymer, polyarylene ether, or other suitable dielectric materials having a dielectric constant below 4, preferably below 3. The dielectric dopants include boron, phosphorus and/or arsenic. The dielectric layer can consist of a single material or a stack of different layers including low-k materials and/or anti-reflective coatings with or without etch stop layers therebetween.

The etched openings can comprise vias, contacts, conductor lines and/or trenches of a dual damascene, a self-aligned contact or self-aligned trench structure. During etching of such openings, the sidewalls must be straight in order to maintain the critical dimension (CD) of the device features and the etch must be selective with respect to the overlying photoresist and/or hardmask layers and the underlying layers. To minimize CD loss and distortions or striations during etching of the dielectric, it is desirable to etch the dielectric while preserving the photoresist and/or hardmask layers, both in terms of thickness and structural integrity. Furthermore, the profile of the etched feature must maintain the critical dimension patterned in lithography.

Because advanced device geometries have high aspect ratio (>10:1) profiles with the distance between contacts (pitch) equal to the contact diameter (<0.18 μm), it is desirable to have an etch process that has high selectivity to photoresist and/or a hardmask, and which minimizes damage and distortion in the resist and/or hardmask. In the absence of resist/hardmask integrity, the contacts etched into the dielectric layer are likely to have distortions or striations which will lead to device failure; also, with poor resist/hardmask selectivity, the critical dimensions of the contact will not be preserved. Furthermore, future generation device processes will rely on new photoresist materials (193 nm photoresist), which are required for smaller device dimensions but have far less resistance to plasma dry etch processes than the current generation of 248 nm photoresist. The advent of 193 nm photoresist has made past processes used for high aspect ratio etches impotent and has introduced new failure mechanisms that require novel approaches to reach viable process regimes.

In the process of the invention it is possible to obtain etched openings 0.3 μm or smaller having substantially straight profiles wherein top, middle and bottom critical dimensions of the openings are substantially the same. The openings can be etched in the dielectric layer so as to have a high aspect ratio such as 5:1 or above, preferably an aspect ratio of at least 10:1. The openings can be etched to depths of at least 2 μm or preferably 3 μm. For example, the etched openings can be 0.2 μm or smaller sized openings having substantially straight profiles wherein top, middle and bottom critical dimensions of the openings are substantially the same, and the openings have an aspect ratio of at least 10:1.

The process of the invention is useful for obtaining extremely high aspect ratios of at least 5:1, preferably at least 10:1 and more preferably at least 20:1. The process is especially useful for obtaining aspect ratios of at least 10:1 for openings smaller than 0.3 μm, preferably smaller than 0.2 μm. For example, it is possible to obtain straight walls with minimal distortions or striations for 0.18 μm openings at depths greater than 2 μm.

The dielectric layer can overlie an electrically conductive or semiconductive layer such as a metal-containing layer selected from the group consisting of Al, Al alloys, Cu, Cu alloys, Ti, Ti alloys, doped or undoped polycrystalline or single crystal silicon, TiN, TiW, Mo, silicides of Ti, W, Co and/or Mo or alloys thereof, etc. If desired, a stop and/or mask layer such as a silicon nitride, silicon carbide, silicon oxynitride, or the like can be provided over the dielectric layer, between dielectric layers and/or between the dielectric layer and conductive layer.

There are a number of device failure mechanisms that can be avoided by having high selectivity to the photoresist and/or hardmask layer and maintaining the material integrity of that layer. One of the these failure mechanisms is related to the loss of critical dimensions of the device feature. Such CD loss can be caused when the photoresist and/or hardmask develops a facet during the dielectric etch. CD loss can also be caused when the photoresist has different thicknesses, either due to original non-uniformity or due to breakdown of the resist material during the etch, and the etch breaks through the resist to expose the underlying dielectric layer at different times. Other device failures may occur if the features are distorted or striated in any way. By adding a silane-containing gas such as silane, $H_2$, or hydrocarbon gas, the structural integrity of the photoresist is maintained during the etch and distortions and striations can be avoided. The addition of silane, $H_2$, or hydrocarbon reactants results in smoother resist surfaces, both in the bulk and at the resist-dielectric layer interface, and the smoothness of the resist minimizes undesired etching of the dielectric layer which could lead to device failure.

The silane-containing gas, hydrogen and/or hydrocarbon gas are preferably added in amounts that effectively control the etch rate selectivity ratio of the etching gas chemistry. That is, when using an etching gas containing a silane-containing gas, hydrogen and/or hydrocarbon gas together with one or more fluorocarbon gases, the additive gas is effective in creating high photoresist/hardmask selectivity and maintaining the structural integrity of the resist. For a medium density plasma reactor, the advantageous effects of the invention can be achieved by supplying the silane-containing gas, hydrogen and/or hydrocarbon reactant and fluorocarbon reactant to the plasma etching reactor such that the flow rate ratio of silane-containing gas to fluorocarbon gas is 0.1 or less, or the flow rate ratio of hydrogen or hydrocarbon gas to fluorocarbon gas is 0.5 or less.

The silane-containing gas can include one or more gases selected from the group consisting of silane, fluorosilane, chlorosilane, difluorosilane, dichlorosilane, trifluorosilane and trichlorosilane. According to a preferred embodiment, the etching gas includes silane as the silane-containing gas. The process of the invention is carried out by energizing the etchant gas into chemically excited states in a plasma state and etching openings in the dielectric layer.

The addition of silane and/or other silane-containing gas, hydrogen and/or hydrocarbon gas enhances the selectivity of the photoresist with respect to the dielectric and maintains the integrity of the resist by keeping it sufficiently free of distortions and damage. Furthermore, the addition of the silane-containing gas, hydrogen or a hydrocarbon gas reduces the amount of bow in a high aspect ratio contact. The addition of the silane-containing gas, hydrogen or hydrocarbon gas works equally well for both 248 nm 193 nm photoresist.

Whereas fluorine-containing and $O_2$-containing etchant gases can lead to CD, profile, and uniformity problems, particularly with 193 nm photoresist applications, the addition of silane, hydrogen or hydrocarbon gas to a fluorocarbon and oxygen-containing etch gas can be effective in providing a desired level of selectivity and photoresist integrity. The addition of silane, hydrogen or hydrocarbon gas to a fluorocarbon and oxygen-containing etch gas can balance polymer build-up sufficiently to protect sidewalls of etched features while avoiding pinch-off and etch stop problems due to excessive polymer build-up on the sidewalls and bottom of the etched features. Specifically, when the silane-containing gas, hydrogen or hydrocarbon gas is added to the plasma, hydrogen can be incorporated into the polymer which protects the sidewalls and the photoresist. When an inert gas such as argon is included in the etching gas, the argon can be used to help strike the plasma.

The polymer build-up can be reduced by the synergistic effect of breaking up the polymer with the optional addition of oxygen to the etching gas mixture. Further, in order to preserve the critical dimension of the etched feature, the oxygen removes enough of the polymer build-up on the sidewalls of the etched openings to avoid excessive build-up of polymer on the sidewalls which otherwise could cause "pinch-off" of the etched openings and thus prevent complete etching of the opening to the desired depth.

The optional addition of an oxygen-containing gas to the plasma etch reactor also helps prevent excessive polymer build-up, which contributes to "etch stop." Etch stop is especially problematic during plasma etching of deep and narrow openings in dielectric materials such as silicon oxide using gas chemistries that form too much polymer, i.e., polymer-build-up in the opening prevents further etching of the silicon oxide. In the process of the invention, the polymer build-up can be mediated by the synergistic effect of building up the polymer with the fluorocarbon and breaking up the polymer with the oxygen in the etching gas mixture. Oxygen is preferably supplied to the plasma etching reactor in amounts effective to prevent etch stop by reacting with polymer at the bottom of the etched openings.

According to a preferred embodiment, the silane may be added to the plasma etch reactor at a flow rate of 0.3 to 10 sccm, and the $H_2$, or hydrocarbon gas may be added to the plasma etch reactor at a flow rate of 1 to 30 sccm. The amount of fluorocarbon gas to be supplied to the plasma reactor should be sufficient to achieve the desired degree of polymerization and etch rate. The fluorocarbon gas may be added to the plasma etch reactor at a flow rate of 3 to 100 sccm. As an example, in a medium density plasma reactor, the total fluorocarbon gas can be supplied in amounts of 3 to 100 sccm, preferably 5 to 30 sccm, and more preferably 10 to 25 sccm.

The etchant gas can further include an optional oxygen-containing gas selected from the group consisting of $O_2$, $O_3$, CO, and $CO_2$ and an optional inert gas selected from the group consisting of He, Ne, Kr, Xe and Ar, and mixtures thereof, the oxygen-containing gas being supplied to the plasma etch reactor at a flow rate of 0 to 500 sccm, and the inert gas being supplied to the plasma etch reactor at a flow rate of 5 to 1000 sccm. Although hydrogen containing fluorocarbons are quite polymerizing, the degree of polymerizing can be controlled through the use of a combination of oxygen-containing and fluorocarbon-containing reactants. The oxygen-containing gas can be supplied to the plasma etching reactor in amounts effective to cut through polymer at the bottom of the etched openings. In a dual-frequency reactor, each frequency can be tuned appropriately to obtain a high etch rate and good etch stop window. For a reactor which forms a medium density plasma, in the case where the oxygen-containing gas comprises $O_2$, the $O_2$ can be supplied to the reactor at a flow rate of 0 to 100 sccm, more preferably 0 to 40 sccm, and most preferably 10 to 20 sccm.

The etching gas mixture also preferably includes Ar as the optional inert gas. However, other inert gases such as He, Ne, Kr and/or Xe can be used as the inert gas. In contrast to a high density etch reactor operated at low chamber pressures, in a medium density plasma reactor argon can be supplied at higher flow rates into the reactor in amounts of 100 to 500 sccm, preferably 200 to 400 sccm. The inert gas preferably aids the oxide etching rate due to sputtering of the oxide and chemical activation of polymer species at the etch front of the feature.

The silane-containing gas, hydrogen and/or hydrocarbon gas may be added to the plasma etch reactor as a standalone gas, or as a pre-diluted mixture, in combination with fluorocarbon, oxygen-containing, and/or inert gases. The etchant gas preferably includes the silane-containing gas, hydrogen and/or hydrocarbon gas and a fluorocarbon gas where the flow rate ratio of the silane-containing gas to fluorocarbon gas is less than or equal to 0.1, or the flow rate ratio of the hydrogen and/or hydrocarbon gas to fluorocarbon gas is less than or equal to 0.5.

According to the invention, the silane-containing gas, hydrogen and/or hydrocarbon and oxygen-containing gases are preferably added in amounts effective to control the profile of the etched feature. For instance, by adjusting the amount of silane-containing gas, hydrogen and/or hydrocarbon gas and oxygen-containing gases relative to the amount of fluorocarbon gas it is possible to form straight profiles. In this case, the profile does not become significantly tapered, instead the bow of the profile is eliminated. As an example, a tapered opening varying in size from 0.3 μm at the top to 0.1 μm at the bottom can be formed using an oxygen-free etching gas mixture of $C_4F_8$, $SiH_4$ and Ar. For straight openings, the preferred amount of the fluorocarbon gas is at least 10× the amount of the silane gas and the preferred amount of oxygen-containing gas is preferably 5 to 40 sccm.

The invention overcomes a problem with prior etching techniques by increasing profile control during etching of openings having high aspect ratios. In order to obtain openings with straight sidewalls it is desirable to control the oxygen addition such that enough polymer is present to avoid or minimize bowing and enough polymer is removed to avoid the etch stop phenomenon. With respect to polymer removal, the effect of the oxygen is balanced by the silane-containing gas, hydrogen and/or hydrocarbon gas addition. For instance, when using $SiH_4$, $H_2$, or hydrocarbon gas it is possible to provide adequate sidewall passivation of the etched opening, i.e., provide polymer buildup of a desired thickness and composition. Accordingly, by selectively adjusting the $O_2$ and $SiH_4$, $H_2$, or hydrocarbon gas flow rates it is possible to obtain straight and narrow high aspect ratio openings.

According to an embodiment of the invention, the silane-containing gas consists of silane. However, other silane-containing gases having the general formula $SiH_xF_{4-x}$ or $SiH_xCl_{4-x}$ may be totally or partially substituted for silane.

It will be apparent to those skilled in the art that the flow rates of the various gases will depend on factors such as the size of the substrate, the type of plasma reactor, the power settings, the vacuum pressure in the reactor, the dissociation rate for the plasma source, etc.

The invention provides a process for plasma etching 0.3, especially 0.25 μm and smaller high aspect ratio features such as vias and contacts in dielectric layers such as silicon oxide layers on semiconductor substrates. In the process, a gas mixture containing fluorocarbon and a silane-containing gas, hydrogen and/or hydrocarbon gas reactants preferably is chemically energized into a plasma state. During the etching process the fluorocarbon and silane-containing gas, hydrogen and/or hydrocarbon gas synergistically react to create carbon and silicon rich polymers that deposit on top of the photoresist and negate the ion bombardment and chemical etch effects on the photoresist.

The plasma can be produced in various types of plasma reactors. Such plasma reactors typically have energy sources that use RF energy, microwave energy, magnetic fields, etc. to produce plasma etch conditions. For instance, a medium density plasma could be produced in a parallel plate etch reactor such as the dual frequency plasma etch reactor described in commonly owned U.S. Pat. No. 6,090,304, the disclosure of which is hereby incorporated by reference. Preferably, an RF bias can be applied to the semiconductor substrate during the etching step. A medium density reactor can produce an ion density of about $10^{11}$ ions/cm$^3$. The method according to the invention is useful for multiple or single wafer processing.

The plasma etch reactor preferably comprises a medium-density parallel plate reactor, triode reactor, or a dual-frequency capacitively coupled plasma reactor including an upper showerhead electrode and a bottom electrode, RF energy being supplied at two different frequencies to either the bottom electrode or at different first and second frequencies to the showerhead electrode and bottom electrode. In the case where the plasma etch reactor is a capacitively coupled plasma reactor, the reactor can have a powered showerhead electrode and a powered bottom electrode, the showerhead electrode being supplied 500 to 3000 watts of RF energy and the bottom electrode being supplied 500 to 3000 watts of RF energy. In a dual frequency reactor the high frequency source controls the plasma chemistry (i.e. the abundance of excited state species) while the low frequency source controls the ion energy (i.e. acceleration of ions into the substrate). In such reactors, it is desirable to maintain the gap between the top electrode and the bottom electrode supporting the semiconductor substrate at a distance of about 1.3 to 2.5 cm.

Medium density plasma reactors operate at higher chamber pressures and dissociate etching gas chemistries to a lesser extent than high density plasma reactors. For instance, in medium density plasma reactors, etching gases such as $C_4F_8$ may dissociate in stages as follows: $C_4F_8 \rightarrow C_2F_8 \rightarrow CF_2 \rightarrow CF+F$. Due to such gradual dissociation, it is possible to achieve a higher etch rate of a dielectric layer and a lower etch rate of an overlying layer such as a photoresist or hardmask or underlayer such as an etch stop layer. The ratio of such etch rates is referred to as the "etch selectivity ratio" and the high selectivity ratios obtainable in medium density plasma reactors promote complete etching of contacts, vias and conductor patterns. In contrast, in high density reactors, the instantaneous dissociation of etching gases can lead to low selectivity ratios due to the higher etch rates of the masking layer and etch stop layers. For example, in high density plasma reactors, $C_4F_8$ dissociates directly to free fluorine and the high content of free fluorine causes such rapid etching of the masking and/or etch stop layers that the etch selectivity ratio is unacceptably low.

The reactor pressure is preferably maintained at a level suitable for sustaining a plasma in the reactor. In general, too low a reactor pressure can lead to plasma extinguishment whereas too high a reactor pressure can lead to the etch stop problem. For medium density plasma reactors such as a dual frequency capacitively coupled etch reactor, the reactor is preferably at a pressure below 200 mTorr such as 20 to 40 mTorr. Due to plasma confinement at the semiconductor substrate undergoing etching, the vacuum pressure at the substrate surface may be higher than the vacuum pressure setting for the reactor, e.g., the pressure at the substrate surface may range from 30 to 100 mTorr, e.g., 45 to 65 mTorr.

The substrate support supporting the semiconductor substrate undergoing etching preferably cools the substrate enough to prevent deleterious side reactions such as burning of any photoresist on the substrate and formation of undesirable reactant gas radicals. In medium density plasma reactors, it is sufficient to cool the substrate support to a temperature of −20 to +80° C. In a parallel-plate plasma reactor or triode type reactor the substrate support can include a bottom electrode for supplying an RF bias to the substrate during processing thereof and an ESC for clamping the substrate. For example, the substrate can comprise a silicon wafer which is electrostatically clamped and cooled by supplying helium (He) at a desired pressure between the wafer and top surface of the ESC, as disclosed in U.S. Pat. No. 5,609,720. In order to maintain the wafer at a desired temperature the He can be maintained at a pressure of 5 to 30 Torr in the space between the wafer and the chuck.

The dielectric layer can optionally be patterned with any suitable photoresist. A commercially available 248 nm resist, for example, may be spin coated on the dielectric layer. The thickness of the 248 nm resist during the etching step may be 500 to 1000 nm. Alternatively, a 193 nm resist may be used. The 193 nm resist can advantageously support 0.18 micron, 0.15 micron and smaller design rules. The 193 nm resist, which is typically about 100 to 500 nm thick, is more sensitive to the plasma etch chemistry. Thus, the etch process must be highly selective to the resist in order to prevent loss of pattern fidelity due to faceting of the resist and/or resist breakthrough prior to completion of the dielectric etch.

Artifacts such as sidewall deposition, sidewall bowing, microtrenching, and mask faceting typically accompany the etching of small features in dielectrics. Striation formation on resist sidewalls, for example, can occur during plasma etching. Striations can modulate the feature edges and lead to degradation of critical dimension. Striation formation can also be decreased by increasing the smoothness of the resist.

If desired, the substrate can include an antireflective coating ("ARC") thereon. The ARC is used to reduce reflection back into the photoresist during exposure in a lithography step and allows better pattern reproduction such as a pattern of openings in the form of vias or trenches formed in the photoresist. The ARC can be any suitable material such as a hydrocarbon film, e.g., a spin-on organic material comprising an organic polymeric compound. The ARC can be spun on the substrate to have a desired thickness, e.g., 60 to 200 nm.

In one embodiment, the invention provides a process for plasma etching high aspect ratio features such as conductor lines, vias and contacts including self aligned contacts (SAC) in dielectric layers on semiconductor substrates. In the process, a gas mixture containing fluorocarbon, oxygen, and silane-containing gas such as silane, $H_2$, or hydrocarbon gas, with an optional gas such as an inert gas (e.g., argon) is energized in a plasma etch reactor into a plasma state such that the non-inert reactants are at least partially dissociated. During the etching process, the dielectric layer is etched by fluorine containing species and the silane-containing gas, $H_2$ or hydrocarbon gas form a carbon and/or silicon-containing protective polymer on the top of the photoresist/hardmask and on sidewalls of the etched openings. The silane-containing gas, $H_2$, or hydrocarbon can cooperate with the oxygen-containing gas to balance polymer build-up sufficiently to protect the photoresist and sidewalls of etched features while avoiding pinch-off and etch stop problems due to excessive polymer build-up. In general, silane-containing gas, $H_2$, or hydrocarbon gas can be used to form polymer on the top of the resist/hardmask and in the etched openings, and oxygen can be added in an amount sufficient to control polymer buildup on the sidewalls of the etched openings. The advantageous effects of the invention can be achieved in a dual-frequency medium density plasma etching reactor by supplying silane-containing gas, $H_2$, or hydrocarbon gas and fluorocarbon gas reactants to the plasma etching reactor at a flow rate ratio of silane-containing gas to fluorocarbon gas of 0.1 or less, or a flow rate ratio of $H_2$ or hydrocarbon gas to fluorocarbon gas of 0.5 or less.

The amount of silane-containing gas, $H_2$, or hydrocarbon gas and oxygen gas is preferably controlled to take into account the size of the features being etched and the film composition of the material being etched. For instance, when etching larger feature sizes less oxygen is needed to protect the sidewalls of the etched openings. For dielectric materials which are less reactive toward the polymer created in the plasma, such as oxide films with low levels of doping, the $C_xF_y/O_2$ ratio may be reduced. However, the $C_xF_y/O_2$ ratio can be higher for dielectric layers containing higher dopant additions, such as for BPSG.

Oxygen and fluorocarbon reactants can each be supplied at flow rates of 5 to 100 sccm, preferably 5 to 50 sccm, and more preferably 5 to 30 sccm. Silane can be supplied at flow rates of 0.3 to 10 sccm and $H_2$ or hydrocarbon gas can be supplied at flow rates of 1 to 30 sccm. As an example, the oxygen reactant flow rate can range from 5 to 20 sccm when $C_xF_yH_z$ is supplied at 5 to 30 sccm, and argon, if supplied, can range from 100 to 600 sccm. In another example, the $C_xF_yH_z$ is $C_4F_6$, the oxygen containing gas is $O_2$ and the $C_4F_6$ and $O_2$ are supplied to the plasma etch reactor at flow rates having a ratio of $C_4F_6:O_2$ of 0.5:1 to 3:1. In an additional example, the $C_4F_6$ and $O_2$ are supplied to the plasma etch reactor at flow rates to avoid etch stop during etching of the openings in a SAC or dual damascene structure. The $O_2$ can be supplemented or replaced with other oxygen containing gases such as CO. For instance, CO can be added to the etch gas at a flow rate of 50 to 500 sccm. Furthermore, the $H_2$ or hydrocarbon can be supplied at a flow rate equal or nearly equal to that of $O_2$, such as 1:1 or 1:2.

In one example, a dual frequency plasma etch reactor (such as the Exelan™ dual frequency capacitively coupled oxide etch system available from Lam Research Corporation, the assignee of the present application) was operated with a top electrode power of 0 to 5000 watts, preferably 1000 to 2000 watts, and a bottom electrode power of 0 to 5000 watts, preferably 1000 to 2000 watts. Straight 0.18 µm openings having depths of about 3 µm can be etched in about 5 minutes in a single step with the chamber pressure set at about 15 mTorr, one or both of the electrodes powered with 1000 watts at 27 MHz and 2000 watts at 2 MHz, using an etch gas mixture of 300 sccm Ar, 8 sccm $O_2$, 1.5 sccm $SiH_4$ or 5 sccm $C_xH_y$ or 5 sccm $H_2$ and 15 sccm $C_4F_8$.

Figure 1B:
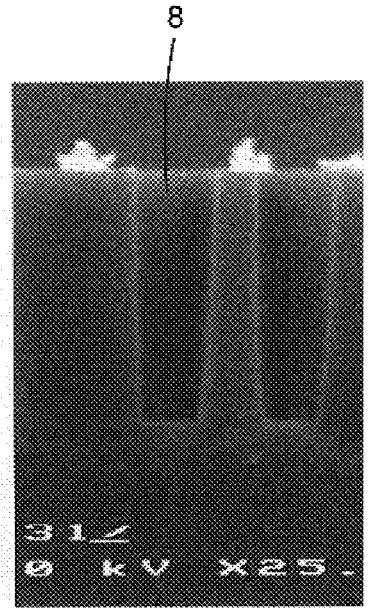
FIG. 1b shows an etched dielectric layer wherein high aspect ratio openings have straight profiles.

FIGS. 1-3 illustrate the effect of silane addition according to the process of the invention. FIG. 1a illustrates the bowed etch profile obtained when using a comparative etch gas mixture which does not include silane while FIG. 1b shows an example of a dielectric layer having straight openings, the openings being etched in accordance with the process according to the invention. In FIG. 1a, a dielectric layer 2 having bowed openings 4 was obtained when the dielectric etch was carried out for about 4 minutes in a single step with the chamber pressure set at about 50 mTorr, one or both of the electrodes powered with around 3000 W total power, 100 to 300 sccm Ar, 5 to 20 sccm $O_2$, and 5 to 20 sccm $C_4F_8$. In FIG. 1b, a dielectric layer 6 having straight openings 8 was obtained using the same process with the addition of 0.5 to 2 sccm $SiH_4$.

Figure 2A:
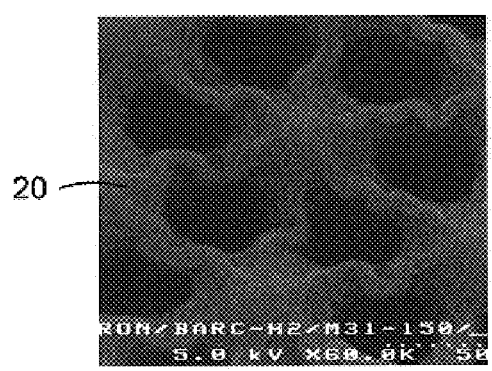
FIGS. 2a and 3a shows a photoresist surface wherein the surface of the resist is rough.
Figure 2B:
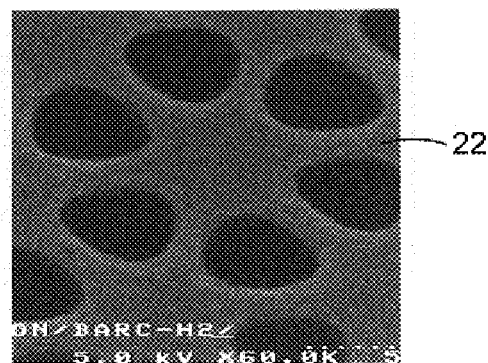
FIGS. 2b and 3b shows a photoresist surface etched in accordance with the invention.
Figure 3A:
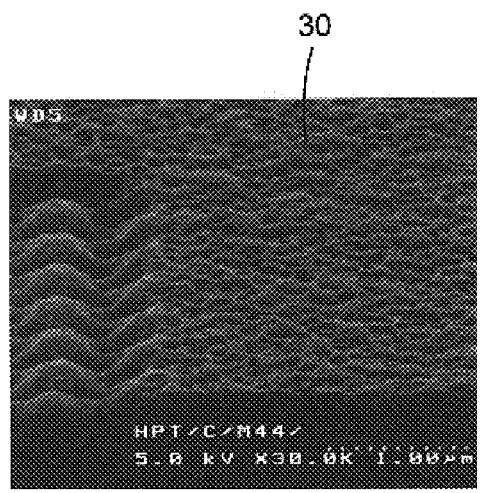
Figure 3B:
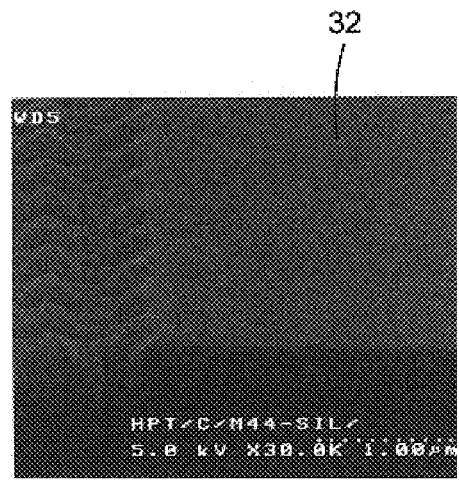

The effect on the 193 nm photoresist of the same process conditions is shown in FIGS. 2-3. Referring to FIG. 2a, in the absence of silane the post-etch resist 20 exhibits a distorted, wrinkled appearance. In contrast, as shown in FIG. 2b, the resist 22 is markedly less wrinkled with the addition of silane. Furthermore, referring to FIG. 3a, the absence of silane produces a rough post-etch resist surface 30 while the addition of silane results in a smoother resist 32, as shown in FIG. 3b. The addition of silane to the reactive gas improves selectively to the 193 nm resist by more than 25%, preferably more than 35%, as compared with a silane-free reactive gas mixture. Similar results can be obtained with addition of either $H_2$ or hydrocarbon gas in place of silane or with other silicons containing gases.

Figure 4:
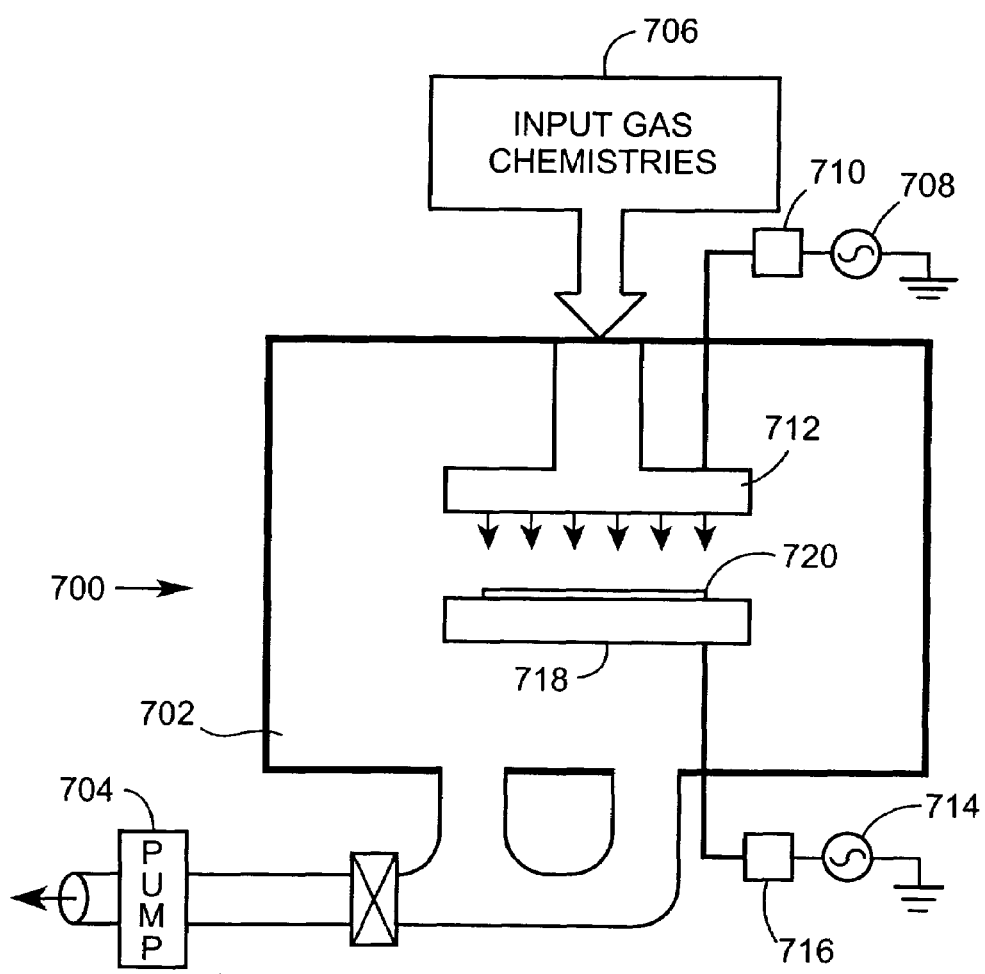
FIG. 4 shows a schematic representation of a medium density parallel plate plasma reactor which can be used to carry out the process of the invention.

The process of the invention can also be carried out in a parallel plate plasma reactor such as reactor 700 shown in FIG. 4. The reactor 700 includes an interior 702 maintained at a desired vacuum pressure by a vacuum pump 704 connected to an outlet in a wall of the reactor. Etching gas can be supplied to a showerhead electrode 712 by supplying gas from gas supply 706. The reactor chamber 700 can be operated as a dual frequency parallel plate processing arrangement where a first RF source 708 is coupled to the top electrode showerhead electrode 712 through an RF matching network 710. In a like manner, the bottom electrode 718 is coupled to a second RF source 714 through a second RF matching network 716. Further, each of the RF sources 708, 714 are coupled at one end to ground. A medium density plasma can be generated in the reactor above a substrate 720 by supplying RF energy from RF sources 708, 714 to the showerhead electrode 712 and a bottom electrode 718 or the showerhead electrode 712 can be electrically grounded and RF energy at two different frequencies can be supplied to the bottom electrode 718. Other types of capacitively coupled reactors can also be used, e.g., reactors having only a powered showerhead or only powered by a bottom electrode.

In a medium density, dual frequency plasma etching reactor, according to the process of the invention the etch rate selectivity of photoresist/hardmask to dielectric advantageously enhanced, the material integrity (resistance to distortion) is reduced, and the smoothness of the photoresist film is increased by the addition of silane-containing gas, $H_2$, and or hydrocarbon reactants. Furthermore, the addition of silane-containing gas, $H_2$, or a hydrocarbon gas reduces the amount of bow in a high aspect ratio contact. In the controlled dissociation environment of medium density, dual frequency reactors, the smoothness and physical integrity of the photoresist, as well as the profile of the feature being etched can be regulated by the addition of silane-containing gas, $H_2$, or hydrocarbon reactants. The addition of silane-containing gas, $H_2$, or hydrocarbon reactants results in the creation of carbon and silicon rich polymers that can deposit on top of the photoresist and negate the ion bombardment and chemical etch effects on the photoresist. Silane-containing gas, $H_2$, or hydrocarbon reactants may be added as a standalone gas, or via a pre-diluted mixture, in combination with argon, oxygen, fluorocarbon, and/or fluorohydrocarbons. The hydrocarbon reactants may be in gaseous or liquid form before introduction into the chamber. The desired flow rate ratio of silane-containing gas to fluorocarbon gases is less than or equal to 0.1. The desired flow rate of $H_2$ or hydrocarbon reactant to fluorocarbon is less than or equal to 0.5.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of etching openings in a dielectric layer, comprising:
   supporting a semiconductor substrate on a substrate support in a plasma etch reactor, the substrate having a dielectric layer and a patterned photoresist layer and/or hardmask above the dielectric layer;
   supplying to the plasma etch reactor an etchant gas comprising (i) a fluorocarbon gas ($C_xF_yH_z$, where $x \geq 1$, $y \geq 1$, and $z \geq 0$), (ii) silane-containing gas, (iii) an optional oxygen-containing gas, and (iv) an optional inert gas; wherein the flow rate ratio of silane-containing gas to fluorocarbon gas is less than or equal to 0.1;
   energizing the etchant gas into a plasma state, and
   etching openings in the dielectric layer with increased photoresist and/or hardmask to dielectric layer selectivity and decreased photoresist distortion or striation,
   wherein the dielectric layer comprises an inorganic low-k material or an organic low-k material.

2. The method of claim 1, wherein the plasma etch reactor comprises a dual-frequency medium-density capacitively coupled plasma reactor including an upper showerhead electrode and a bottom electrode, RF energy being supplied at two different frequencies to either the bottom electrode or at different first and second frequencies to the showerhead electrode and bottom electrode.

3. The method of claim 2, wherein the showerhead electrode is supplied 500 to 3000 watts of RF energy and the bottom electrode is supplied 500 to 3000 watts of RF energy.

4. The method of claim 1, wherein an RF bias is applied to the semiconductor substrate during the etching step.

5. The method of claim 1, wherein the pressure in the plasma etch reactor is 5 to 200 mTorr and/or the temperature of the substrate support is −20° C. to +80° C.

6. The method of claim 1, wherein the openings comprise vias, contacts, and/or trenches of a dual damascene, self-aligned contact or self-aligned trench structure.

7. The method of claim 1, wherein the openings are 0.3 µm or smaller sized openings having substantially straight profiles wherein top, middle and bottom critical dimensions of the openings are substantially the same, and the openings have an aspect ratio of at least 5:1.

8. The method of claim 1, wherein the openings are 0.25 μm or smaller sized openings having substantially straight profiles wherein top, middle and bottom critical dimensions of the openings are substantially the same, and the openings have an aspect ratio of at least 10:1.

9. The method of claim 1, wherein the dielectric layer overlying a conductive layer selected from the group consisting of Al, Al alloys, Cu, Cu alloys, Ti, Ti alloys, doped or undoped polycrystalline or single crystal silicon, TiN, TiW, Mo, silicides of Ti, W, Co and/or Mo or alloys thereof, the semiconductor substrate including an optional stop layer and/or mask layer selected from silicon nitride, silicon carbide or silicon oxynitride over the dielectric layer and/or between the dielectric and conductive layer.

10. A method of etching openings in a dielectric layer, comprising:
supporting a semiconductor substrate on a substrate support in a dual frequency medium density capacitively coupled plasma etch reactor, the substrate having a dielectric layer that comprises a stack of layers of low-k materials with or without etch stop layers therebetween, and a patterned photoresist layer and/or hardmask above the dielectric layer;
supplying to the plasma etch reactor an etchant gas comprising (i) a fluorocarbon gas ($C_xF_yH_z$, where $x \geq 1$, $y \geq 1$, and $z \geq 0$), comprising at least $C_4F_8$, (ii) silane-containing gas, (iii) an optional oxygen-containing gas, and (iv) an optional inert gas; wherein the flow rate ratio of silane-containing gas to fluorocarbon gas is less than or equal to 0.1;
energizing the etchant gas into a plasma state, wherein $C_4F_8$ undergoes dissociation according to the stages $C_4F_8 \rightarrow C_2F_8 \rightarrow CF_2 \rightarrow CF + F$; and
etching openings in the dielectric layer to depths of at least 2 μm with increased photoresist and/or hardmask to dielectric layer selectivity and decreased photoresist distortion or striation,
wherein the dielectric layer comprises an inorganic low-k material or an organic low-k material.

11. The method of claim 1, wherein the $C_xF_yH_z$ forms a protective sidewall polymer on sidewalls of the etched openings; the silane-containing gas maintains a desired concentration of polymer precursor species in the reactor; and the oxygen-containing gas maintains a desired thickness of the sidewall polymer.

12. The method of claim 1, wherein the etchant gas comprises an inert gas selected from the group consisting of He, Ne, Kr, Xe and Ar, the inert gas being supplied to the plasma etch reactor at a flow rate of 5 to 1000 sccm.

13. The method of claim 1, wherein the silane-containing gas comprises silane and the etchant gas comprises 5 to 30 sccm $C_4F_8$, 0.5 to 3 sccm silane, 0 to 20 sccm $O_2$, and 100 to 500 sccm Ar.

14. The method of claim 1, wherein $C_xF_yH_z$ comprises at least one hydrogen-free fluorocarbon and/or at least one hydrogen-containing fluorocarbon.

15. The method of claim 1, wherein the silane-containing gas comprises silane and the etchant gas comprises 3 to 100 sccm $C_xF_yH_z$, 0.3 to 10 sccm silane, 0 to 500 sccm oxygen-containing gas, and 5 to 1000 sccm Ar.

16. The method of claim 15, wherein the oxygen-containing gas is selected from the group consisting of $O_2$, $O_3$, CO, $CO_2$ and mixtures thereof.

17. The method of claim 1, wherein tapered openings are formed in the dielectric layer using an oxygen-free etchant gas.

18. The method of claim 1, wherein straight openings are formed in the dielectric layer using an oxygen-containing etchant gas supplied to the plasma etch reactor at a flow rate of 5 to 500 sccm oxygen-containing etchant gas.

19. A method of etching openings in a dielectric layer, comprising:
supporting a semiconductor substrate on a substrate support in a plasma etch reactor, the substrate having a dielectric layer and a patterned photoresist layer and/or hardmask above the dielectric layer;
supplying to the plasma etch reactor an etchant gas comprising (i) a fluorocarbon gas comprising $C_4F_6$, (ii) silane-containing gas, (iii) $O_2$ and (iv) an optional inert gas; wherein the flow rate ratio of silane-containing gas to fluorocarbon gas is less than or equal to 0.1 and wherein the $C_4F_6$ and $O_2$ are supplied to the plasma etch reactor at flow rates having a flow rate ratio of $C_4F_6:O_2$ of 0.5:1 to 3:1;
energizing the etchant gas into a plasma state, and
etching openings in the dielectric layer with increased photoresist and/or hardmask to dielectric layer selectivity and decreased photoresist distortion or striation,
wherein the dielectric layer comprises an inorganic low-k material or an organic low-k material.

20. The method of claim 1, wherein the addition of silane to the etchant gas improves by more than 35% the resist selectively as compared with a silane-free etchant gas.

21. The method of claim 1, wherein the etchant gas includes silane supplied at a flow rate of at least 0.3 sccm.

22. The method of claim 1, wherein the etchant gas includes hydrocarbon gas supplied at a flow rate at least 1 sccm.

* * * * *